United States Patent
Tan

(10) Patent No.: US 9,123,629 B2
(45) Date of Patent: Sep. 1, 2015

(54) CHIP PACKAGE AND METHOD FOR FORMING THE SAME

(71) Applicant: Silergy Semiconductor Technology (Hangzhou) Ltd., Hangzhou (CN)

(72) Inventor: Xiaochun Tan, Hangzhou (CN)

(73) Assignee: Silergy Semiconductor Technology (Hangzhou) Ltd., Hangzhou (CN)

( * ) Notice: Subject to any disclaimer, the term of this patent is extended or adjusted under 35 U.S.C. 154(b) by 0 days.

(21) Appl. No.: 14/529,543

(22) Filed: Oct. 31, 2014

(65) Prior Publication Data

US 2015/0115439 A1    Apr. 30, 2015

(30) Foreign Application Priority Data

Oct. 31, 2013 (CN) .......................... 2013 1 0533175

(51) Int. Cl.
*H01L 21/44* (2006.01)
*H01L 23/00* (2006.01)
*H01L 23/31* (2006.01)

(52) U.S. Cl.
CPC ................ *H01L 24/17* (2013.01); *H01L 23/31* (2013.01); *H01L 24/81* (2013.01); *H01L 2924/01029* (2013.01); *H01L 2924/182* (2013.01)

(58) Field of Classification Search
CPC ........... H01L 2924/01079; H01L 2924/01078; H01L 2924/01029; H01L 2924/01013; H01L 2924/14; H01L 2924/182; H01L 24/17; H01L 24/81; H01L 23/31
USPC ......... 257/737–738, 666, 781–781, 777, 778, 257/779, 672; 438/106–107, 109–110, 123, 438/612–614, 617, 666
See application file for complete search history.

(56) References Cited

U.S. PATENT DOCUMENTS

2013/0277829 A1* 10/2013 Yee et al. ...................... 257/737

FOREIGN PATENT DOCUMENTS

| CN | 101814480 A | 8/2010 |
|---|---|---|
| CN | 102376671 A | 3/2012 |
| CN | 102832189 A | 12/2012 |
| CN | 103000608 A | 3/2013 |
| CN | 103021989 A | 4/2013 |

(Continued)

*Primary Examiner* — Hoa B Trinh
(74) *Attorney, Agent, or Firm* — Westman, Champlin & Koehler, P.A.

(57) ABSTRACT

The present disclosure relates to a chip package and a method for forming the same. The chip package comprises a carrier pad, a chip, and a plurality of second conductive bumps, and a molding compound. The carrier pad has a first surface with a plurality of first conductive bumps formed thereon. The chip has an active surface. One end of each of the plurality of second conductive bumps is electrically coupled to the active surface, and the other end of each of the plurality of second conductive bumps is electrically coupled to the first conductive bumps. The molding compound encapsulates the chip and completely fills space between the carrier pad and the chip. In the chip package and the method for forming the same according to the present disclosure, the first conductive bumps are formed on the first surface of the carrier pad by etching, which provides an electrical connection between the first conductive bumps and the active surface of the chip, and broadens a flow channel of the molding compound between the chip and the carrier pad so that the molding compound can completely fill the space between the chip and the carrier pad. Underfill before encapsulation is not needed and the package cost is thus lowered.

9 Claims, 3 Drawing Sheets

(56) References Cited

FOREIGN PATENT DOCUMENTS

| CN | 103035604 A | 4/2013 |
| CN | 103400819 A | 11/2013 |
| CN | 103545297 A | 1/2014 |
| CN | 203521406 U | 4/2014 |
| CN | 203536409 U | 4/2014 |

* cited by examiner

CHIP PACKAGE AND METHOD FOR FORMING THE SAME

CROSS-REFERENCE TO RELATED APPLICATION

This application claims the benefit of Chinese Patent Application No. 201310533175.4, filed on Oct. 31, 2013, which is incorporated herein by reference in its entirety.

TECHNICAL FIELD

The present disclosure generally relates to the field of a chip package, and more particularly, to a chip package and a method for forming the same.

BACKGROUND

With the development of science and technology, various chip packages are proposed for various kinds of chips. In these chip packages, a dual flat package (DFP) and a quad flat non-leaded package (QFN), especially in a flip-chip manner, are recently widely used because they have a small thickness, a high integration level and improved heat dissipation. The QFN/DFN flip chip has a first surface facing downward to and being electrically coupled to a carrier pad. The first surface of the chip is an active surface with various electronic devices disposed thereon. The carrier pad may be a large-area intermediate pad of a lead frame, or a printed circuit board (PCB).

Referring now to FIG. 1, a package structure of a conventional QFN/DFN flip chip is shown. As shown in FIG. 1, the package structure 10 of the conventional QFN/DFN flip chip includes a carrier pad 11, a chip 12, a plurality of conductive bumps 13, a molding compound 14 and a plurality of leads 15. The carrier pad 11 has a relatively large area to ensure good heat dissipation performance. The leads 15 are located at edges of the carrier pad 11 and have a thickness the same as that of the carrier pad 11. The chip 12 has an active surface formed with electrodes for various electronic devices. Contact pads (not shown) are formed on the electrodes, corresponding to locations of the electrodes on the active surface. Typically, the contact pads are arranged in an array and are each electrically coupled to the carrier pad 11 or leads 15 by means of conductive bumps 13.

The carrier pad 11 has a uniform thickness anywhere. The conductive bumps 13 have a thickness equal to a distance between the chip 12 and the carrier pad 11. Typically, the conductive bumps 13 are made of copper and have a thickness about 45 micrometers.

The molding compound 14 cannot flow freely between the carrier pad 11 and the chip 12 and cannot completely fill the space between the carrier pad 11 and the chip 12, because the molding compound 14 flows in the space between the carrier pad 11 and the chip 12, which corresponds to gaps between adjacent ones of the conductive bumps 13. Moreover, the chip 12 has a small thickness. Consequently, the chip may be damaged. To solve the problem, one approach is to fill the space between the chip 12 and the carrier pad 11 with an adhesive 16 before encapsulation. The adhesive 16 contains small particles and has good fluidity to ensure a filling effect and solve the problem of fine pitches in the package. As shown in FIG. 1, the adhesive 16 fills the space between the carrier pad 11 and the chip 12, and the molding compound 14 encapsulates other parts of the chip 12.

Nowadays, various chips, including the QFN/DFN flip chip, have a decreased thickness. Underfill is necessary and performed between the carrier pad 11 and the chip 12 before encapsulation to ensure quality of the package. However, underfill will increase package cost and process complexity.

Accordingly, it is an urgent problem for one skilled person to avoid damage of electronic devices in the prior chip package due to a small distance between the chip and the carrier pad and insufficient filling of the molding compound in the space between the chip and the carrier pad.

SUMMARY

One object of the present disclosure is to provide a chip package and a method for forming the same to solve the problem of damage of electronic devices in the prior chip package due to a small distance between the chip and the carrier pad and insufficient filling of the molding compound in the space between the chip and the carrier pad.

According to one aspect of the present disclosure, there is provided a chip package, comprising a carrier pad, a chip, a plurality of second conductive bumps and a molding compound, wherein the carrier pad has a first surface with a plurality of first conductive bumps formed thereon;

the chip has an active surface, and each of the plurality of second conductive bumps has a first end electrically coupled to the active surface and the other end electrically coupled to the first conductive bumps; and the molding compound encapsulates the chip and completely fills space between the carrier pad and the chip.

Preferably, in the chip package, the first conductive bumps have a thickness in the range between 20 micrometers and 250 micrometers.

Preferably, in the chip package, the molding compound is an epoxy resin.

Preferably, the chip package further comprises a plurality of leads;

the plurality of leads are arranged at edges of the carrier pad and have lead pads at surfaces of the plurality of leads, wherein the surfaces of the lead pads flush with those of the first conductive bumps.

Preferably, the chip package further comprises a plurality of third conductive bumps;

each of the plurality of third conductive bumps has a first end electrically coupled to the active surface and the other end electrically coupled to the first conductive bumps of the carrier pad.

Preferably, in the chip package, the second conductive bumps and the third conductive bumps are all made of copper and have a thickness in the range between 45 micrometers and 60 micrometers.

According to another aspect of the present disclosure, there is provided a method for forming a chip package, comprising:

providing a carrier pad;

forming a plurality of first conductive bumps on a first surface of the carrier pad by etching the carrier pad;

providing a chip having an active surface;

providing a plurality of second conductive bumps;

electrically coupling the active surface to the first conductive bumps by means of the second conductive bumps;

providing a molding compound;

encapsulating the chip so that the molding compound completely fills space between the carrier pad and the chip.

Preferably, the method for forming the chip package further comprises providing a plurality of leads while providing the carrier pad;

the plurality of leads are arranged at edges of the carrier pad and have lead pads at surfaces of the plurality of leads, wherein the surfaces of the lead pads flush with those of the first conductive bumps.

Preferably, the method for forming the chip package further comprises providing a plurality of third conductive bumps while providing the plurality of second conductive bumps;

electrically coupling the active surface to the lead pads by means of the third conductive bumps while electrically coupling the active surface to the first conductive bumps by means of the second conductive bumps.

Preferably, in method for forming the chip package, the second conductive bumps and the third conductive bumps are all made of copper and have a thickness in the range between 45 micrometers and 60 micrometers.

In the chip package and the method for forming the same according to the present disclosure, the first conductive bumps are formed on the first surface of the carrier pad by etching, which provides an electrical connection between the first conductive bumps and the chip, and broadens a flow channel of the molding compound between the chip and the carrier pad so that the molding compound can completely fill the space between the chip and the carrier pad. Underfill before encapsulation is not needed and the package cost is thus lowered.

DESCRIPTION OF EMBODIMENTS

Reference may now be made in detail to particular embodiments of a chip package and a method for forming the same according to the present disclosure, examples of which are illustrated in the accompanying drawings. Other advantages and features of the present disclosure will become readily apparent from claims and the detailed description of preferred embodiments below. The accompanying drawings are illustrative and not intended to be limiting, but are examples of embodiments of the invention, are simplified for explanatory purposes, and are not drawn to scale.

Figure 3A:
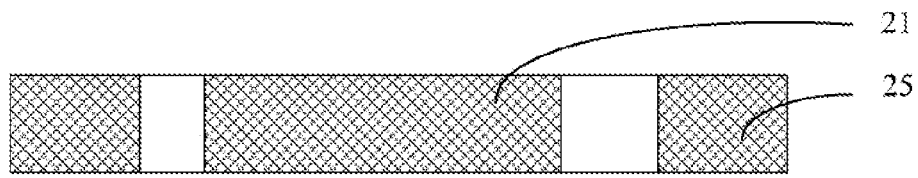
FIGS. 3a to 3e are schematic diagrams showing structures of a chip package at various steps of a method for forming a chip package according an embodiment of the present disclosure.
Figure 3B:
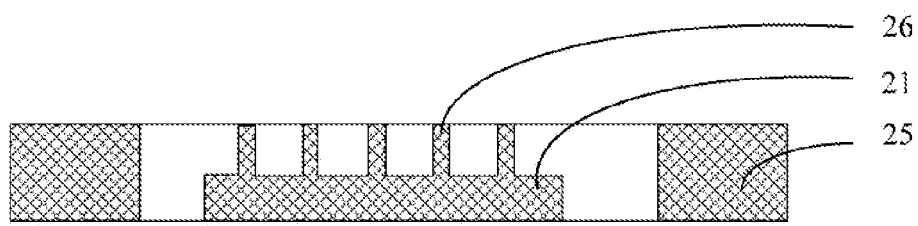
Figure 3C:
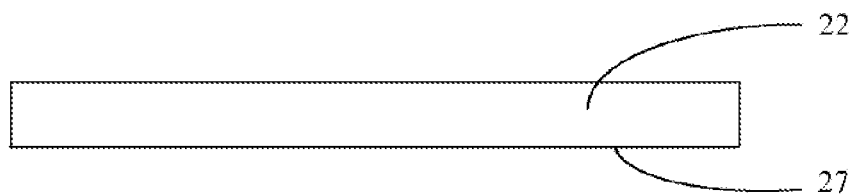
Figure 3D:
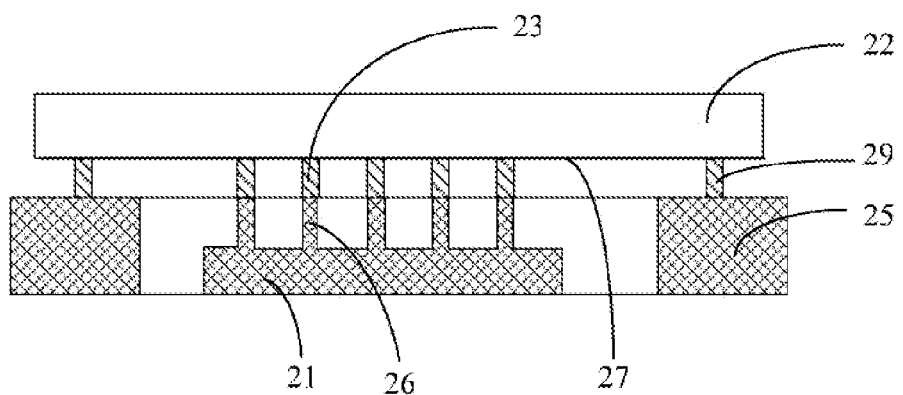
Figure 3E:
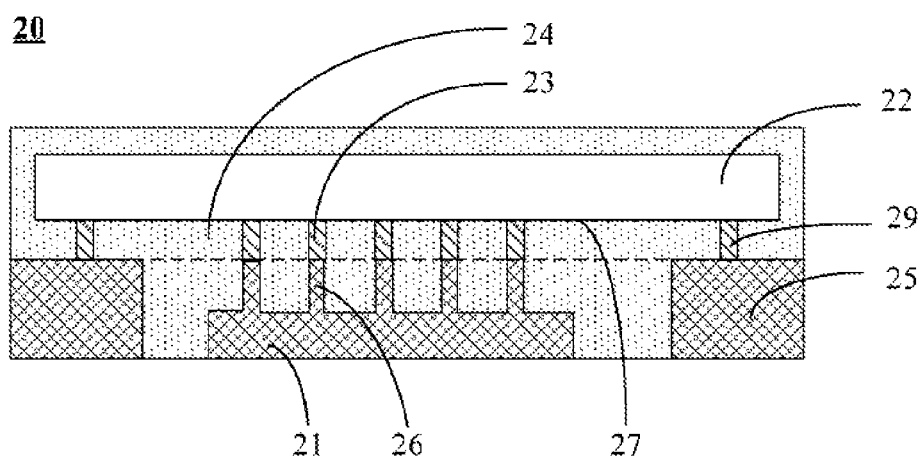

Referring now to FIG. 3e, a structure after encapsulation of a chip package according to an embodiment of the present disclosure is shown in a schematic diagram. As shown in FIG. 3e, the chip package 20 includes a carrier pad 21, a chip 22, a plurality of second conductive bumps 23, and a molding compound 24. The carrier pad 21 has a first surface with a plurality of first conductive bumps 26 formed thereon. The chip 22 has an active surface 27. One end of each of the plurality of second conductive bumps 23 is electrically coupled to the active surface 27, and the other end of each of the plurality of second conductive bumps 23 is electrically coupled to the first conductive bumps 26. The molding compound 24 encapsulates the chip 22 and completely fills space between the carrier pad 21 and the chip 22.

Specifically, the carrier pad 21 has a uniform thickness, with an overall thickness typically in the range between 100 micrometers and 300 micrometers. The first conductive bumps 26 on the first surface of the carrier pad 21 have a thickness typically in the range between 20 micrometers and 250 micrometers. Gaps are provided between adjacent ones of the first conductive bumps 26, the size of which is determined mainly by the thickness of the first conductive bumps 26. That is, a larger thickness of the first conductive bumps 26 means larger gaps, or vise versa.

One end of the second conductive bumps 23 is electrically coupled to the active surface 27 of the chip 22, and the other end of the second conductive bumps 23 is electrically coupled to the first conductive bumps 26 of the carrier pad 21. After the chip 22 is electrically coupled to the carrier pad 21 by means of the plurality of second conductive bumps 23, the molding compound 24 may flow in a space between the chip 22 and the carrier pad 21, including the gaps between adjacent ones of the second conductive bumps 23 and the gaps between the adjacent ones of the first conductive bumps 26.

That is, the space where the molding compound flows in the chip package 20 includes the gaps between adjacent ones of the first conductive bumps 26, in addition to the gaps between adjacent ones of the second conductive bumps 23. As a comparison, the prior QFN/DFN flip-chip package 10 provides only gaps between adjacent ones of the conductive bumps 13 as the space where the molding compound flows. Accordingly, the space where the molding compound flows is larger in the chip package 20 according to the present disclosure than in the prior QFN/DFN flip-chip package 10.

In the embodiments according to the present disclosure, the molding compound 24 may be an epoxy resin, surrounding the chip 22 and filling the space between the carrier pad 21 and the chip 22.

Referring again to FIG. 3e, the chip package 20 further includes a is plurality of leads 25 at edges of the carrier pad 21. The leads 25 have surfaces on which lead pads (not shown) are provided. The surfaces of the lead pads flush with those of the first conductive bumps 26. The leads 25 are electrically coupled to the active surface 27 by means of respective ones of the third conductive bumps 29.

The second conductive bumps 23 and the third conductive bumps 29 both have thicknesses in the range between 45 micrometers and 60 micrometers. The second conductive bumps 23 and the third conductive bumps 29 may be made of any suitable conductive material, such as gold, silver, copper, or the like. Preferably, the second conductive bumps 23 and the third conductive bumps 29 are both made of copper.

The number of the first conductive bumps 26 and that of the leads 25, also their locations, correspond to the number and locations of electronic devices in the chip 22.

Figure 1:
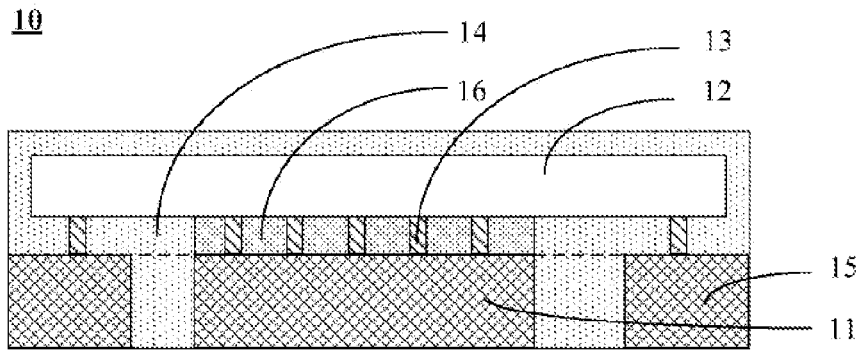
FIG. 1 is a schematic diagram showing a package structure of a conventional QFN/DFN flip chip.
Figure 2:
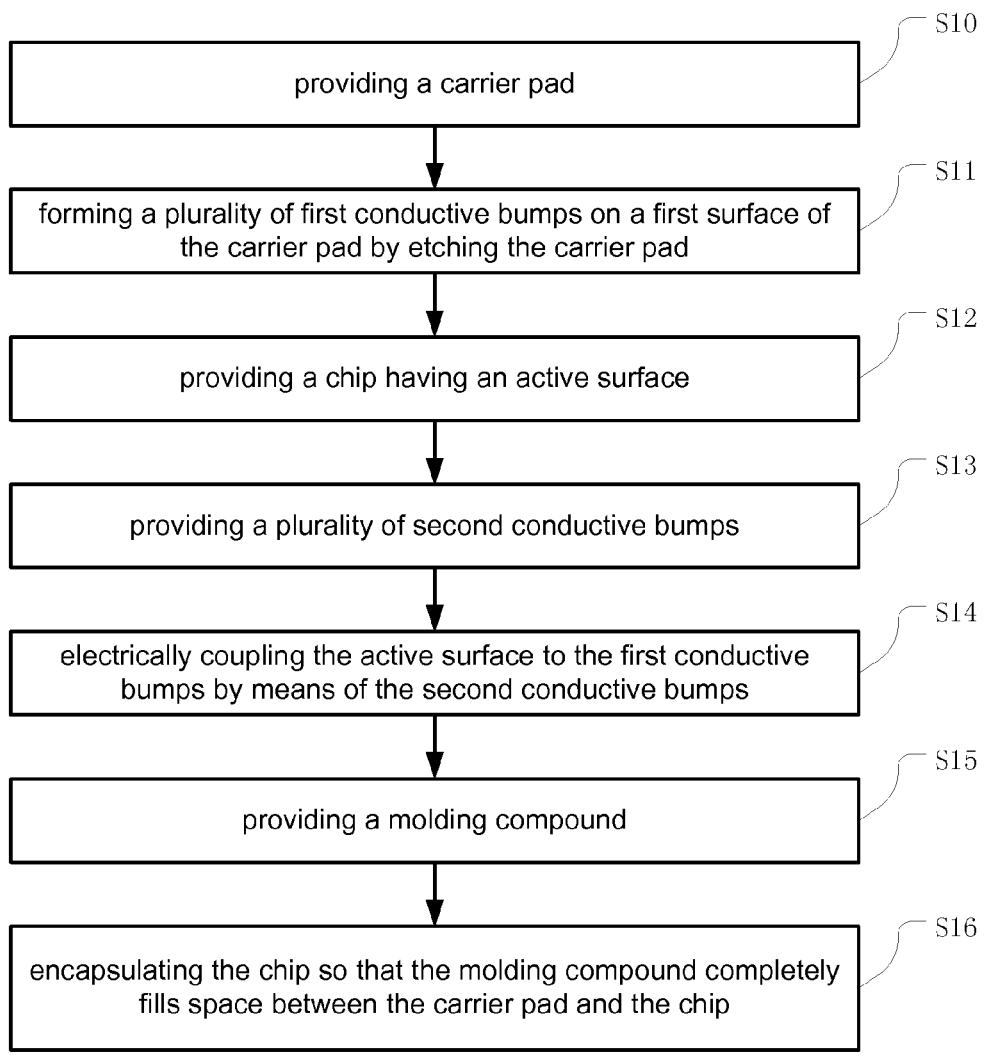
FIG. 2 is a flow chart showing various steps of a method for forming a chip package according an embodiment of the present disclosure.

According to another aspect of the present disclosure, there is provided a method for forming a chip package. Referring now to FIG. 2 and in conjunction with FIGS. 3a to 3e, the method for forming the chip package is shown as having the following steps.

S10: providing a carrier pad 21;

S11: forming a plurality of first conductive bumps 26 on a first surface of the carrier pad 21 by etching the carrier pad 21;

S12: providing a chip 22 having an active surface 27;

S13: providing a plurality of second conductive bumps 23;

S14: electrically coupling the active surface 27 to the first conductive bumps 26 by means of the second conductive bumps 23;

S15: providing a molding compound 24;

S16: encapsulating the chip 22 so that the molding compound 24 completely fills space between the carrier pad 21 and the chip 22.

Specifically, a carrier pad 21 having a uniform thickness and a plurality of leads 25 are firstly provided. The carrier pad 21 and the leads 25 may be made of those known materials. The carrier pad 21 may be a large-area intermediate pad of a lead frame, or a printed circuit board (PCB). As shown in FIG. 3a, the carrier pad 21 and the leads 25 have the same thickness, typically in the range between 100 micrometers and 300 micrometers. The plurality of leads 25 are arranged at the edges of the carrier pad 21, with lead pads (not shown) formed at the surfaces of the leads 25.

A plurality of first conductive bumps 26 are then formed on a first surface of the carrier pad 21 by etching the carrier pad 21. As shown in FIG. 3b, after forming the plurality of first conductive bumps 26 on the surface of the carrier pad 21 by etching the carrier pad 21, the first conductive bumps 26 have surfaces flushing with those of the leads 25 (i.e. the surfaces of the lead pads). After forming the first conductive bumps 26, the carrier pad 21 has a non-uniform thickness, with a large thickness where the first conductive bumps 26 are formed and a small thickness where no first conductive bumps 26 are formed. The first conductive bumps 26 typically have a thickness in the range between 20 micrometers and 250 micrometers.

The chip 22 is then provided. The chip 22 has an active surface 27. As shown in FIG. 3c, a plurality of contact pads (not shown) are provided on the active surface 27, corresponding to the locations of first conductive bumps 26 and the lead pads.

A plurality of second conductive bumps 23 and a plurality of third conductive bumps 29 are then provided between the contact pads of the chip 22 and the first conductive bumps 26 and between the contact pads of the chip 22 and the lead pads, respectively. Thus, the contact pads of the chip 22 are electrically coupled to the first conductive bumps 26 by means of the second conductive bumps 23, and the contact pads of the chip 22 are electrically coupled to the lead pads by means of the third conductive bumps 29. In this step, the second conductive bumps 23 and the third conductive bumps 29 are simultaneously provided and electrically coupled.

As shown in FIG. 3d, the plurality of second conductive bumps 23 are provided between the contact pads on the active surface 27 and the first conductive bumps 26. One end of each of the second conductive bumps 23 is electrically coupled to the respective one of the contact pads on the active surface 27, and the other end of each of the second conductive bumps is electrically coupled to the respective one of the first conductive bumps. The plurality of third conductive bumps 29 are provided between the contact pads of the chip 22 and the leads 25. One end of each of the third conductive bumps 29 is electrically coupled to the respective one of the contact pads on the active surface 27, and the other end of each of the third conductive bumps 29 is electrically coupled to the respective one of the lead pads of the leads 25.

The second conductive bumps 23 and the third conductive bumps 29 both have thicknesses in the range between 45 micrometers and 60 micrometers. The second conductive bumps 23 and the third conductive bumps 29 may be made of any suitable conductive material, such as gold, silver, copper, or the like. Preferably, the second conductive bumps 23 and the third conductive bumps 29 are both made of copper.

Referring now to FIG. 3d, there are gaps between adjacent ones of the first conductive bumps 26. The molding compound 24 can flow in a space between the chip 22 and the carrier pad 21, including both the gaps between adjacent ones of the first conducive bumps 23 and the gaps between adjacent ones of the first conductive bumps 26. A size of the space is determined by the thickness of the first conductive bumps 26 and the thickness of the second conductive bumps 23. That is, a larger thickness of the first conductive bumps 26 and a larger thickness of the first conductive bumps 23 mean a larger size of the flow space, or vice versa.

The molding compound 24 is then provided. In this embodiment, the molding compound 24 is an epoxy resin.

Finally, the chip 22 is encapsulated by the molding compound 24 so that the molding compound 24 completely fills the space between the carrier pad 21 and the chip 22. As shown in FIG. 3e, the molding compound 24 is firstly injected around the chip 22 and into the space between the chip 22 and the carrier pad 21, and then cured. After curing, the molding compound (for example, epoxy resin) encapsulates the whole chip 22 and fills completely the space between the carrier pad 21 and the chip 22.

The chip package 20 is completed after this step. In the chip package 20, the carrier pad 21 is etched to form the first conductive bumps 26, which provides an effective space between the chip 22 and the carrier pad 21 and broadens a flow channel of the molding compound 24 between the chip 22 and the carrier pad 21 so that the molding compound 24 can completely fill the space between the chip 22 and the carrier pad 21. Underfill before encapsulation is not needed in the method or forming the chip package. Without underfill, the chip package still has good package quality.

In view of cost concern, the epoxy resin is typically used for encapsulating the chip 22 and the space between the carrier pad 21 and the chip 22, without filling the space between the carrier pad 21 and the chip 22 using an adhesive before the encapsulation.

To sum up, in the chip package and the method for forming the same according to the present disclosure, the first conductive bumps are formed on the first surface of the carrier pad by etching before encapsulation, corresponding to the contact pads of the chip. The first conductive bumps provide an electrical connection between the first conductive bumps and the contact pads of the chip, and broaden a flow channel of the molding compound between the chip and the carrier pad so that the molding compound can completely fill the space between the chip and the carrier pad. Thus, underfill before encapsulation is not needed, which decreases stepson of the method forming the chip package and reduces the package cost.

The embodiments were chosen and described in order to best explain the principles of the invention and its practical applications, to thereby enable others skilled in the art to best utilize the invention. The invention is intended to cover alternatives, modifications and equivalents that may be included within the spirit and scope of the invention as defined by the appended claims.

What is claimed is:

1. A chip package, comprising:
    a carrier pad having a first surface with a plurality of first conductive bumps formed thereon;
    a chip having an active surface;
    a plurality of second conductive bumps between said carrier pad and said chip;
    a plurality of leads being arranged at edges of said carrier pad and having lead pads at surfaces of said plurality of leads, and
    a molding compound,
    wherein each of said plurality of second conductive bumps has a first end electrically coupled to said active surface and the other end electrically coupled to said first conductive bumps,
    said surfaces of said lead pads flush with those of said first conductive bumps, and said molding compound encapsulates said chip and completely fills space between said carrier pad and said chip.

2. The chip package according to claim 1, wherein said first conductive bumps have a thickness in the range between 20 micrometers and 250 micrometers.

3. The chip package according to claim 1, wherein said molding compound is an epoxy resin.

4. The chip package according to claim 1, further comprising a plurality of third conductive bumps,
   wherein each of said plurality of third conductive bumps has a first end electrically coupled to said active surface and the other end electrically coupled to said lead pads.

5. The chip package according to claim 4, wherein said second conductive bumps and said third conductive bumps are all made of copper and have a thickness in the range between 45 micrometers and 60 micrometers.

6. A method for forming a chip package, comprising:
   providing a carrier pad;
   forming a plurality of first conductive bumps on a first surface of said carrier pad by etching said carrier pad;
   providing a chip having an active surface;
   providing a plurality of second conductive bumps;
   electrically coupling said active surface to said first conductive bumps by means of said second conductive bumps;
   providing a molding compound;
   encapsulating said chip so that said molding compound completely fills space between said carrier pad and said chip.

7. The method according to claim 6, wherein a plurality of leads are provided while providing said carrier pad;
   said plurality of leads are arranged at edges of said carrier pad and have lead pads at surfaces of said plurality of leads, wherein said surfaces of said lead pads flush with those of said first conductive bumps.

8. The method according to claim 7, wherein a plurality of third conductive bumps are provided while providing said plurality of second conductive bumps;
   electrically coupling said active surface to said lead pads by means of said third conductive bumps while electrically coupling said active surface to said first conductive bumps by means of said second conductive bumps.

9. The method according to claim 8, wherein said second conductive bumps and said third conductive bumps are all made of copper and have a thickness in the range between 45 micrometers and 60 micrometers.

* * * * *